(12) United States Patent
Tavkhelidze et al.

(10) Patent No.: US 6,680,214 B1
(45) Date of Patent: *Jan. 20, 2004

(54) ARTIFICIAL BAND GAP

(75) Inventors: Avto Tavkhelidze, Tbilisi (GE);
Jonathan Sidney Edelson, Somerville, MA (US); Isaiah Watas Cox, London (GB); Stuart Harbron, Berkhamsted (GB)

(73) Assignee: Borealis Technical Limited (GI)

( * ) Notice: Subject to any disclaimer, the term of this patent is extended or adjusted under 35 U.S.C. 154(b) by 526 days.

This patent is subject to a terminal disclaimer.

(21) Appl. No.: 09/634,615

(22) Filed: Aug. 5, 2000

Related U.S. Application Data

(63) Continuation-in-part of application No. 09/093,652, filed on Jun. 8, 1998, now abandoned.
(60) Provisional application No. 60/149,805, filed on Aug. 18, 1999.

(51) Int. Cl.$^7$ .............................. G25F 3/02; H01L 21/00
(52) U.S. Cl. .............................. 438/20; 216/40; 216/54; 216/66; 216/67; 430/199; 430/296; 430/302; 430/310
(58) Field of Search ................................ 216/11, 40, 54, 216/66, 67; 430/199, 296, 302, 310; 438/20, 689, 725, 463, 464; 250/493.1; 257/10, 11

(56) References Cited

U.S. PATENT DOCUMENTS

| | | |
|---|---|---|
| 4,686,162 A | 8/1987 | Stangl et al. |
| 5,023,671 A | 6/1991 | DiVincenzo et al. |
| 5,119,151 A | 6/1992 | Onda |
| 5,229,320 A | 7/1993 | Ugajin |
| 5,233,205 A | 8/1993 | Usagawa et al. |
| 5,247,223 A | 9/1993 | Mori et al. |
| 5,332,952 A | 7/1994 | Ugajin et al. |
| 5,371,388 A | 12/1994 | Oda |
| 5,432,362 A | 7/1995 | Lippens et al. |
| 5,521,735 A | 5/1996 | Shimizu et al. |
| 5,579,232 A | 11/1996 | Tong et al. |
| 5,654,557 A | 8/1997 | Taneya et al. |
| 5,719,407 A | 2/1998 | Ugajin |
| 5,722,242 A | 3/1998 | Edelson |
| 5,772,905 A | 6/1998 | Chou |
| 6,117,344 A | 9/2000 | Cox et al. |
| 6,281,514 B1 | 8/2001 | Tavkhelidze |

OTHER PUBLICATIONS

Chou et al., Imprint Lithography with 25 Namometer Resolution, SCIENCE, Apr. 5, 1996, pp85–87, vol 272.

*Primary Examiner*—Savitri Mulpuri

(57) ABSTRACT

A method is disclosed for the induction of a suitable band gap and electron emissive properties into a substance, in which the substrate is provided with a surface structure corresponding to the interference of electron waves. Lithographic or similar techniques are used, either directly onto a metal mounted on the substrate, or onto a mold which then is used to impress the metal. In a preferred embodiment, a trench or series of nano-sized trenches are formed in the metal.

20 Claims, 7 Drawing Sheets

ARTIFICIAL BAND GAP

CROSS REFERENCE TO RELATED APPLICATIONS

This application claims priority to U.S. Provisional Patent Application No. 60/149,805, filed on Aug. 18, 1999, and a con't in-part of U.S. patent application Ser. No. 09/093,652, filed Jun. 8, 1998; and is related to U.S. patent application Ser. No. 09/020,654, filed Feb. 9, 1998 now U.S. Pat. No. 6,281,514, all of which are herein incorporated by reference in their entirety.

BACKGROUND OF THE INVENTION

1. Field of the Invention

The present invention is concerned with methods for fabricating nanostructures to develop a band gap, and elementary particle emission properties.

2. Description of Related Art

Semiconductors, or semiconducting materials, have a small energy band gap (about one eV or less) between the conduction band and the valence band associated with the solid. This gap in energy distribution is useful for microelectronics such as lasers, photodetectors, and tunnel junctions. Intrinsic semiconductors (not doped by another element) conduct due to the effect that raising the temperature will raise the energy of some electrons to reach the conduction band. Intrinsic semiconductors usually have a very low conductivity, due to the difficulty of exciting an electron by approximately one eV.

Silicon is a commonly used semiconducting material and has limited electrical conductivity. In using silicon, designers of semiconductor devices are bound by the inherent material limitations of silicon.

The electrical conductivity of a semiconducting material is enhanced by adding small amounts of impurities, such as gallium arsenide. However, the process by which dopants are implanted in a semiconductor substrate of a semiconductor device is expensive and time-consuming. Also, the designing of semiconductor devices using doped materials currently known in the art, such as silicon and gallium arsenide, often requires a lengthy and expensive trial and error process to achieve the desired band gap.

From the foregoing, it may be appreciated that a need has arisen for a band gap material that does not require doping, or materials having other characteristics, to produce a desired band gap, and a method for making such a band gap material.

A. Quantum Mechanics and the De Broglie Wave

It is well known in quantum mechanics that elementary particles have wave properties as well as corpuscular properties. The probability of finding an elementary particle at a given location is $|\psi|^2$ where $\psi$ is a complex wave function and has form of a de Broglie wave, as follows:

$$\psi = A\, \exp[(-i2\pi/h)(Et - pr)] \qquad (1)$$

where h is Planck's constant; E is an energy of the particle; p is an impulse of the particle; r is a vector connecting initial and final locations of the particle; and t is time.

There are well known fundamental relationships between the parameters of this probability wave and the energy and the impulse of the particle.

The wave number k related to the impulse of the particle as follows:

$$p = (h/2\pi)k \qquad (2)$$

The de Broglie wavelength, $\lambda$, is given by:

$$\lambda = 2\pi/k \qquad (3)$$

At zero time, t=0, the space distribution of the probability wave may be obtained. Accordingly, substituting (2) into (1) gives:

$$\psi = A\, \exp(ikr) \qquad (4)$$

FIG. 1 shows an elementary particle wave moving from left to right perpendicular to a surface 104 dividing two domains. The surface is associated with a potential barrier, which means the potential energy of the particle changes as it passes through it.

Incident wave 101 Aexp(ikx) moving towards the border will mainly reflect back as reflected wave 103 βAexp(−ikx), and only a small part leaks through the surface to give transmitted wave 102 α(x)Aexp(ikx) (β≈1>>α). This is known as quantum mechanical tunneling. The elementary particle will pass the potential energy barrier with a low probability, depending on the potential energy barrier height.

B. Electron Interference

Usagawa in U.S. Pat. No. 5,233,205 discloses a novel semiconductor surface in which interaction between carriers such as electrons and holes in a mesoscopic region and the potential field in the mesoscopic region leads to such effects as quantum interference and resonance, with the result that output intensity may be changed. Shimizu in U.S. Pat. No. 5,521,735 discloses a novel wave combining and/or branching device and Aharanov-Bohm-type quantum interference devices which have no curved waveguide, but utilize double quantum well structures.

Mori in U.S. Pat. No. 5,247,223 discloses a quantum interference semiconductor device having a cathode, an anode and a gate mounted in vacuum. Phase differences among the plurality of electron waves emitted from the cathode are controlled by the gate to give a quantum interference device operating as an AB type transistor.

C. Tunneling Through Potential Barriers

In U.S. patent application Ser. No. 09/020,654, filed Feb. 9, 1998, entitled "Method for Increasing Tunneling through a Potential Barrier", Tavkhelidze teaches a method for promoting the passage of elementary particles at or through a potential barrier comprising providing a potential barrier having a geometrical shape for causing de Broglie interference between said elementary particles.

Referring to FIG. 2, two domains are separated by a surface 201 having an indented shape, with height a. An incident probability wave 202 is reflected from surface 201 to give two reflected waves. Wave 203 is reflected from top of the indent and wave 204 is reflected from the bottom of the indent. The reflected probability wave will thus be:

$$A\beta\exp(-ikx) + A\beta\exp[-ik(x+2a)] = A\beta\exp(-ikx)[1 + \exp(-ik2a)] \qquad (5)$$

When $k2a = \pi + 2\pi n$, $\exp(-i\pi) = -1$ and equation (5) will equal zero.

Physically this means that for $k2a = (2\pi/\lambda)2a = \pi + 2\pi n$ and correspondingly $a = \lambda(1+2n)/4$, the reflected probability wave equals zero. Further this means that the particle will not reflect back from the border. Leakage of the probability wave through the barrier will occur with increased probability and will open many new possibilities for different practical applications.

Indents on the surface should have dimensions comparable to the de Broglie wavelength of an electron. In particular the indent height should be:

$$a = n\lambda/2 + \lambda/4 \qquad (6)$$

Here n=0,1,2, etc., and the indent width should be on the order of $2\lambda$. If these requirements are satisfied, then elementary particles will accumulate on the surface.

For semiconductor material, the velocities of electrons in an electron cloud is given by the Maxwell-Boltzman distribution:

$$F(v)dv = n(m/2\pi K_B T)\exp(-mv^2/2K_B T)dv \qquad (7)$$

where F(v) is the probability of an electron having a velocity between v and v+dv.

The average velocity of the electrons is:

$$V_{av} = (3K_B T/m)^{1/2} \qquad (8)$$

and the de Broglie wavelength corresponding to this velocity, calculated using formulas (2), (3) and the classical approximation p=mv is:

$$\lambda = h/(3mK_B T)^{1/2} = 62 \text{ Å for } T=300K. \qquad (9)$$

This gives a value for a of 62/4=15.5 Å. Indents of this depth may be constructed on a surface by a number of means known in the art of micro-machining. Alternatively, the indented shape may be introduced by depositing a series of islands on the surface.

In metals, free electrons are strongly coupled to each other and form a degenerate electron cloud. Pauli's exclusion principle teaches that two or more electrons may not occupy the same quantum mechanical state: their distribution is thus described by Fermi-Dirac rather than Maxwell-Boltzman. In metals, free electrons occupy all the energy levels from zero to the Fermi level ($\epsilon_f$).

Probability of occupation of energy states is almost constant in the range of $0-\epsilon_f$ and has a value of unity. Only in the interval of a few $K_B T$ around $\epsilon_f$ does this probability drop from 1 to 0. In other words, there are no free states below $\epsilon_f$. This quantum phenomenon leads to the formal division of free electrons into two groups: Group 1, which comprises electrons having energies below the Fermi level, and Group 2, comprising electrons with energies in the interval of few $K_B T$ around $\epsilon_f$.

For Group 1 electrons, all states having energies a little lower or higher are already occupied, which means that it is quantum mechanically forbidden for them to take part in current transport. For the same reason electrons from Group 1 cannot interact with the lattice directly because it requires energy transfer between electron and lattice, which is quantum mechanically forbidden.

Electrons from Group 2 have some empty energy states around them, and they can both transport current and exchange energy with the lattice. Thus only electrons around the Fermi level are taken into account in most cases when properties of metals are analyzed.

For electrons of Group 1, two observations may be made. The first is that, if one aims to create a physical surface structure to achieve electron wave interference, it is substantially easier to fabricate a structure for Group 1 electron wave interference, since their wavelength of 50–100 Å corresponds to about $0.01\epsilon_f$, ($E \sim k^2 \sim (1/\lambda)^2$). Group 2 electrons of single valence metals, on the other hand, where $\epsilon_f$=2–3 eV, have a de Broglie wavelength of around 5–10 Å which is much smaller and more difficult to fabricate.

The second observation is that for quantum mechanical interference between de Broglie waves to take place, the mean free path of the electron should be large. Electrons from Group 1 satisfy this requirement because they effectively have an infinite mean free path due to their very weak interaction with the lattice and impurities within the lattice.

If an electron from Group 1 has $k_0=\pi/2a$ and energy $\epsilon_0$, and is moving to the indented surface 201. As discussed above, this particular electron will not reflect back from the surface due to interference of de Broglie waves, and will leave the metal in the case where the potential barrier is such type that allows electron tunneling (e.g. an electric field is applied from outside the metal or there in another metal nearby).

Consider further that the metal is connected to a source of electrons, which provides electron 2, having energy close to $\epsilon_f$ (Group 2). As required by the thermodynamic equilibrium, electron 2 will lose energy to occupy state $\epsilon_0$, losing energy $\epsilon_f-\epsilon_0$, for example by emission of a photon with energy $\epsilon=(\epsilon_f-\epsilon_0)$. If this is absorbed by electron 3, electron 3 will be excited to a state having energy $\epsilon_f+\epsilon_p=2\epsilon_f-\epsilon_0$.

Thus as a consequence of the loss of electron 1, electron 3 from the Fermi level is excited to a state having energy $2\epsilon_f-\epsilon_0$, and could be emitted from the surface by thermionic emission or tunnel trough potential barrier. The effective work function of electron 3 is reduced from the value of $\phi$ to $\phi-\epsilon_f+\epsilon_0=\phi-(\epsilon_f-\epsilon_0)$. In other words, the work function of electron 3 is reduced by $\epsilon_f-\epsilon_0$.

Thus indents on the surface of the metal not only allow electron 1 to tunnel with high probability by interference of the de Broglie wave, but also result in the enhanced probability of another electron emission (electron 3) by ordinary thermionic emission. The present invention deals with methods for constructing such a surface.

In the case that the potential barrier does not allow tunneling, the indented surface creates electron de Broglie wave interference inside the metal, which leads to the creation of a special region below the fermi energy level. Inside that region, the number of possible quantum states is dramatically decreased so that it could be regarded as an energy gap.

Thus this approach has a two-fold benefit. Firstly, providing indents on a surface of a metal creates for that metal a band gap, and secondly, this approach will decrease the effective potential barrier between metal and vacuum (the work function) in the case that the potential barrier is of such a type that an electron can tunnel through it.

This approach has many applications, including applications usually reserved for conventional semiconductors. Other applications include cathodes for vacuum tubes, thermionic converters, vacuum diode heat pumps, photoelectric converters, cold cathode sources, and many other in which electron emission from the surface is used.

In addition, an electron moving from vacuum into an anode electrode having an indented surface will also experience de Broglie interference, which will promote the movement of said electron into said electrode, thereby increasing the performance of the anode.

D. Lithography

The development of low-cost, high-throughput techniques that can achieve resolutions of less than 50 nm is essential for the future manufacturing of semiconductor integrated circuits and the commercialization of electronic, opto-electronic, and magnetic nanodevices. Numerous technologies are under development. Scanning electron beam lithography has demonstrated 10 nm resolution; however, because it exposes point by point in a serial manner, the current throughput of the technique is too low to be economically practical for mass production of sub-50 nm structures. X-ray lithography has demonstrated 20 nm resolution in a contact printing mode and can have a high throughput, but its mask technology and exposure systems are currently rather complex and expensive. Lithographies based on scanning proximal probes, which have shown a resolution of about 10 nm, are in the early stages of development.

Conventional e-beam lithography involves exposing a thin layer of resist (usually a polymer film) coated on a metal film, itself deposited on a substrate, to an electron beam. To create the desired pattern in the resist, the electron beam is scanned across the surface in a predetermined fashion. The chemical properties of the resist are changed by the influence of the electron beam, such that exposed areas may be removed by a suitable solvent from the underlying metal film. The surface of the exposed metal film is etched, and finally unexposed resist is removed by another solvent.

In the etching process, the isotropic properties of the metal mean that the etchant will etch in both depth and in a direction parallel to the substrate surface under the resist. The depth of etching under the resist is approximately the same as the thickness of the metallic film.

If this approach is used to create two metal strip lines which are as narrow as possible and separated by a minimum possible distance, then the under-etching means that the width of strip is decreased and the distance between the strips is increased. In addition, part of the resist under-etched can collapse, which makes the edge of the strip irregular, or break during subsequent fabrication steps.

Overall, this means that the width of the strip is less than desired, and the distance between the strips is more than planned. Very thin strips can be produced, but the minimum distance between strips is greater than wanted. In another words, strips can be made which are even less wide than the e-beam focusing dimension, but distance between strips is greater than expected. In addition non-regularities on the strip edges are obtained.

E. Focused Ion Beam Systems (FIB)

One approach to overcome the under-etch is focused ion beam (FIB) processing. This approach is described in U.S. Pat. No. 4,639,301 to Doherty et al., and uses an apparatus which makes possible the precise sputter etching and imaging of insulating and other targets, using a finely focused beam of ions. This apparatus produces and controls a submicron beam of ions to precisely sputter etch the target. A beam of electrons directed on the target neutralizes the charge created by the incident ion beam. The FIB system can precisely deposit either insulating or conducting materials onto an integrated circuit. However, this approach requires each item to be produced separately, and consequently is slow and expensive.

F. Nano-Imprint Lithography (NIL)

Another approach to creating nano-structures is described by Chou et al., Science, Volume 272, Apr. 5 1996, pages 85 to 87, entitled "Imprint Lithography with 25-nanometer Resolution." Chou et al. demonstrate an alternative lithographic method, imprint lithography, that is based on compression molding and a pattern transfer process. Compression molding is a low-cost, high-throughput manufacturing that provides features with sizes of >1 μm which are routinely imprinted in plastics. Compact disks based on imprinting in poly-carbonate are one example. Other examples are imprinted polymethylmethacrylate (PMMA) structures with a feature size on the order of 10 μm and imprinted polyester patterns with feature dimensions of several tens of micrometers. However, compression molding has not been developed into a lithographic method to pattern semiconductors, metals, and other materials used in semiconductor integrated circuit manufacturing.

Chou's approach uses silicon dioxide molds on a silicon substrate. The mold was patterned with dots and lines having a minimum lateral feature size of 25 nm by means of electron beam lithography, and the patterns were etched into the $SiO_2$ layer by fluorine-based RIE. This mold is pressed into a thin PMAA resist cast on a substrate, which creates a thickness contrast pattern in the resist. After the mold is removed, an anisotropic etching process is used to transfer the pattern into the entire resist thickness by removing the remaining resist in the compressed areas. This imprinted PMAA structure has structures with 25 nm feature size and a high aspect ratio, smooth surfaces with a roughness of less than 3 nm and corners with nearly 90° angles. The structures, though of little use in nano-electronic devices, are useful as masters in a lift off process for making nanostructures in metals: 5 nm of Ti and 15 nm of Au are deposited onto the entire sample, and then the metal on the PMMA surface is removed as the PMMA is dissolved in acetone.

Chou's approach thus requires two stages to produce the finished metal structure: first, nanoimprint lithography into a polymer mold; and second, a metal lift-off and reactive ion etch. The number of steps used will clearly bear on the difference between the original mold and the final product. In addition, the lift-off process destroys the polymer mold, which means that a new PMAA mold must be produced in each process cycle.

SUMMARY OF THE INVENTION

The present invention is a set of related methods for fabricating nanostructures of required proportions in a material to give that material a desired band gap for emitting elementary particles. The required proportions substantially follow the following guidelines: Indents on the surface should have dimensions comparable to de Broglie wavelength of an electron. In particular, the indent or protrusion pitch is:

$$a = n\lambda/2 + \lambda/4 \tag{6}$$

where n is an integer, such as 0,1,2, etc. and the width of protrusions or indentations should be of order of $2\lambda$.

An object of the invention is to provide a method for creating nanostructures of particular proportions in a material to develop in that material a band gap, and elementary particle emission. A feature of the invention is that nanostructures are made on the surface of a substrate by stamping a nano-structured mold or stamp into a softened film of material, preferably metal, coated on a substrate. An advantage of the invention is that the complex and costly process of e-beam lithography is used only once for making the mold or stamp, which is used subsequently for the production of many hundreds of substrates having metal nano-structures on their surface.

Another advantage of the present invention is that the metal nanostructure may be produced from the nano-structured mold or stamp in a single step.

A further advantage of the present invention is that the dimensions of the structures created are limited only by the focusing possibilities of the electron beam or ion beam used to fabricate the mold.

An object of the present invention is to provide a method for removing excess metal remaining on the substrate surface after the mold is removed which leaves 90° angles in the nano-structure unchanged.

An advantage of the present invention is that removal of the thin layer of metal by means of bombardment with charged particles is easy to control and it simultaneously cleans the surface.

BRIEF DESCRIPTION OF THE DRAWINGS

For a more complete explanation of the present, reference is made to the following description and the accompanying drawings, in which.

1. REFERENCE NUMERALS USED IN THE DRAWINGS

Figure 1:
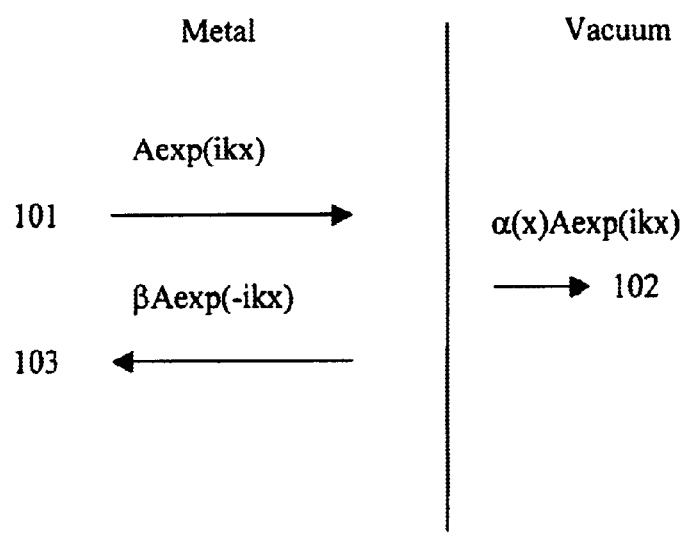
FIG. 1 illustrates an incident probability wave, reflected probability wave and a transmitted probability wave.

- 101. Incident probability wave
- 102. Probability wave leaking through barrier
- 103. Reflected probability wave
- 104. Surface dividing two domains
- 201. Indented surface dividing two domains
- 202. Incident probability wave
- 203. Probability wave reflected from the bottom of the indent
- 204. Probability wave reflected from the top of the indent
- 205. Probability wave leaking through barrier
- 301. Charged particle beam
- 303. Polymer
- 305. Substrate
- 307. Molecules modified by charged particle beam
- 309. Metal film
- 311. Anisotropic etching
- 401. Charged particle beam
- 403. Polymer
- 405. Substrate
- 407. Molecules modified by charged particle beam
- 411. Anisotropic etching
- 413. Second material deposition
- 505. Substrate
- 514. Mold
- 515. Softened metal film
- 605. Substrate
- 609. Metal film
- 610. Oxidized regions

DETAILED DESCRIPTION OF THE INVENTION

The invention is a method for constructing a surface to a material for increasing de Broglie interference and thus creating a suitable band gap for electron emission from the surface. A material's surface structure is formed in a configuration that provides a desired interference pattern in the wave probability functions of an electron approaching the surface. Alternatively, the invention may use elementary particles other than electrons. The desired interference pattern produces a suitable band gap for the surface, for electron emission.

The configuration of the surface may resemble a corrugated pattern of squared-off, "u"-shaped ridges and/or valleys. Alternatively, the pattern may be a regular pattern of rectangular "plateaus" or "holes," where the pattern resembles a checkerboard. Further, one of ordinary skill in the art will recognize that other configurations are possible which may produce the desired interference of wave probability functions.

Materials useful for producing the above suitable surface structures comprise those that, under stable conditions, will not form an oxide layer, or will form an oxide layer of a known and reliable thickness. In any case, the thickness of an oxide layer formed on the material should not so obscure the relief of the surface that the conductive benefits of the geometrical shape of the surface are lost. Preferred materials include, but are not restricted to, metals such as gold and chrome, and materials that under stable conditions form an oxide layer preferably of less than about ten nanometers, and more preferably of less than about five nanometers. In an embodiment of the invention, deliberate and focused oxidation of sections of the surface creates the required pattern in the non-oxidized sections of the surface, causing the necessary interference and bringing out the benefits of a suitable band gap surface.

In an embodiment of the present invention, the surface is gold. In alternative embodiments, other metals are used.

The required proportions for the surface are as follows: Indents on the surface have dimensions comparable to the de Broglie wavelength of an electron. In particular, indent or protrusion pitch should be:

$$a = n\lambda/2 + \lambda/4 \tag{6}$$

where $\lambda$ is the de Broglie wavelength for the electrons and n is an integer, preferably having a value between 0 and 50 inclusive, (n=0, 1, 2, ... 50) and more preferably having a value between 0 and 16 (n=0, 1, 1, ... 16), and still more preferably having a value between 0 and 4 (n=0, 1, 2, 3, 4).

Where the protrusions or indentations are of a trench-like shape running across the surface, their width should be of order of $2\lambda$, and likewise the distance between two adjacent protrusions or indentations. However, the shape is not always trench-like, as described later, having instead regular or irregular shaped closed protrusions, or any other structure that allows for wave interference. A preferred pitch-to-width ratio is approximately 1:8. In some cases, this ratio may be as large as 1:10 or even 1:15. The width may be as wide as about 10 nanometers, or as narrow as about 1 nanometer. The preferred pitch is the predicted best mode of the invention, however, because these sizes are incredibly tiny, experimentation will probably provide the most reasonable and effective sizing.

Figure 2:
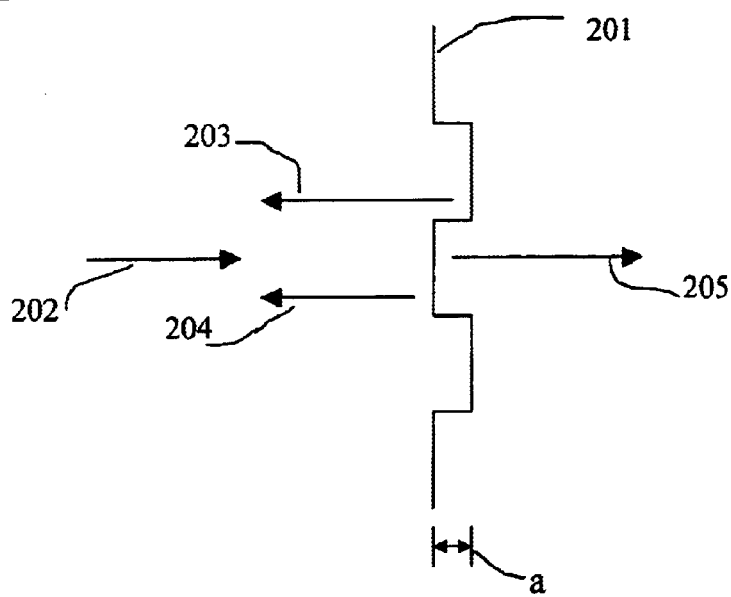
FIG. 2 illustrates an incident probability wave, two reflected probability waves, and a transmitted probability wave interacting with a surface having a series of indents (or protrusions).
Figure 3A:
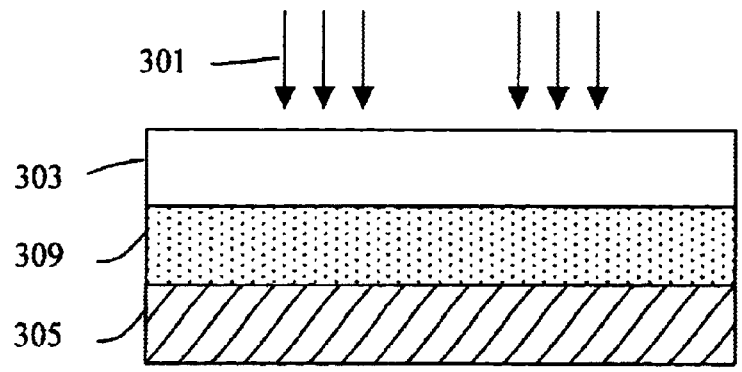
FIGS. 3(a)–(e) is a schematic representation of a process for using a charged particle beam and subsequent etching to make a nano-structured surface in a metal film coated on a substrate. The process may be used to create a resultant surface, or to create a mold used for stamping subsequent surfaces, of the required dimensions.
Figure 3B:
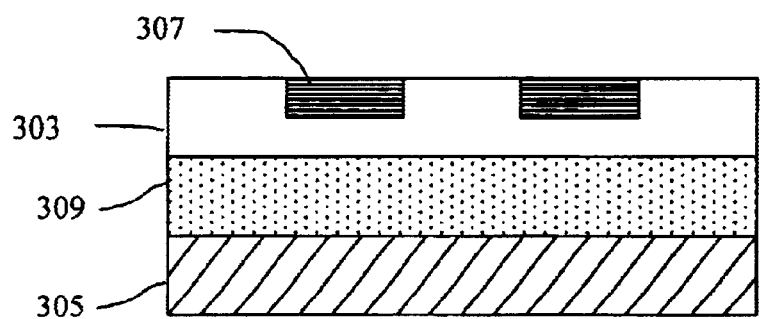
Figure 3C:
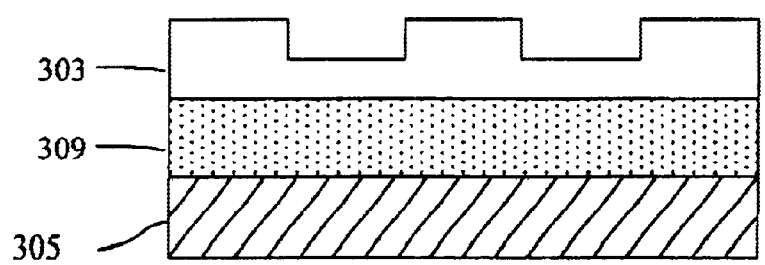
Figure 3D:
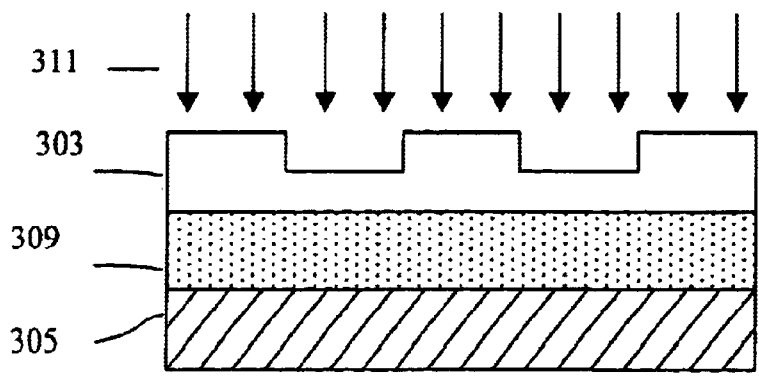
Figure 3E:
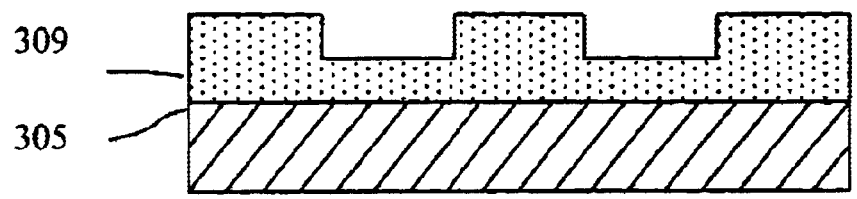
Figure 4A:
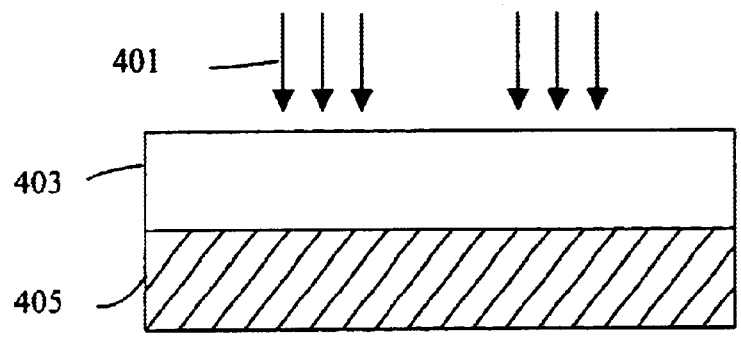
FIGS. 4(a)–(g) is a schematic representation of a process for using a charged particle beam to pattern the surface of a first material deposited onto a substrate, subsequent development, etching, and deposition of a second material, to create islands of the second material on the surface of a substrate, according to the required dimensions.
Figure 4B:
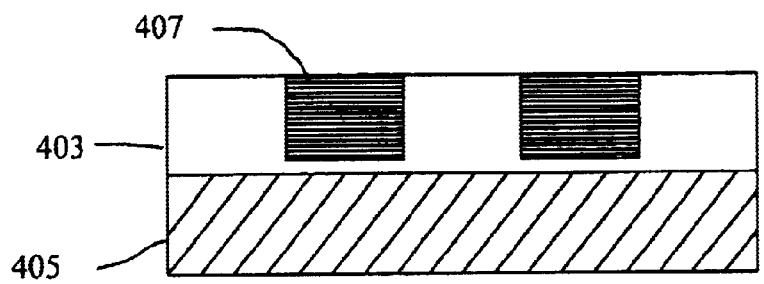
Figure 4C:
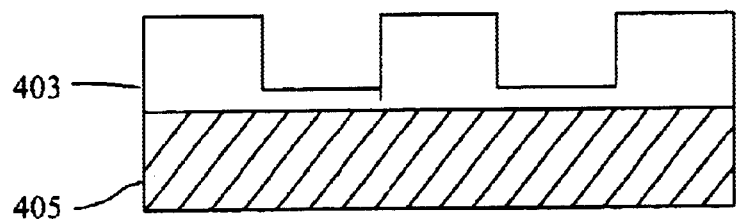
Figure 4D:
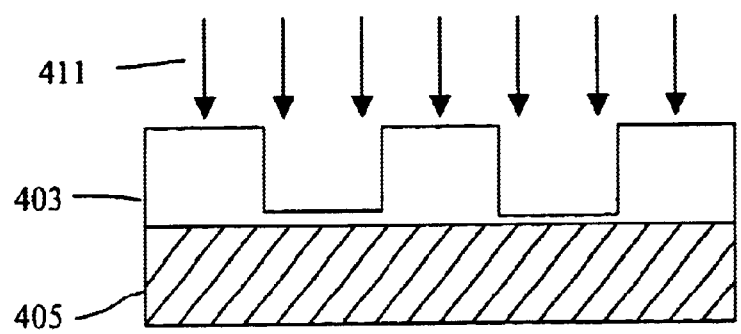
Figure 4E:
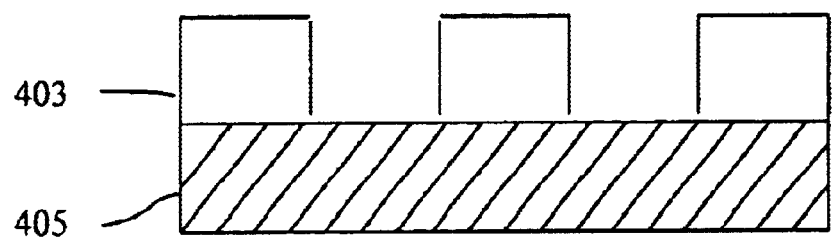
Figure 4F:
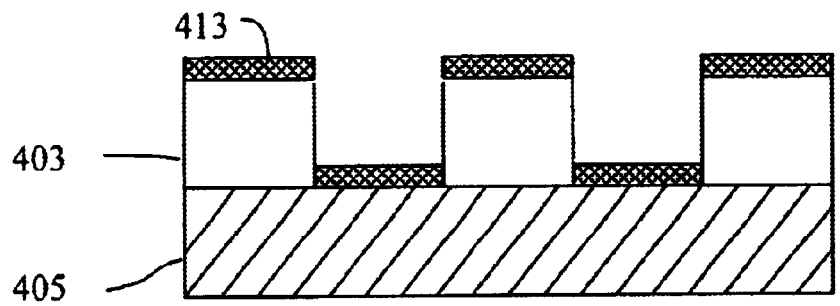
Figure 4G:
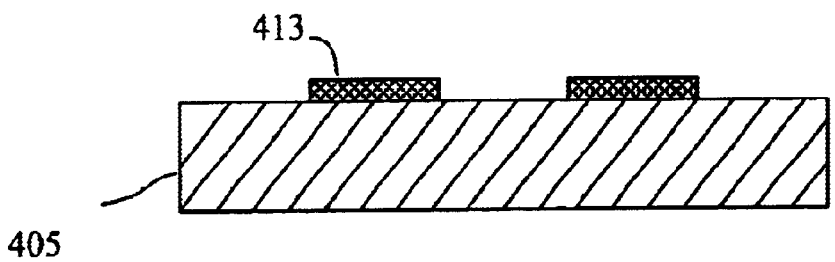

FIG. 2 shows a surface configured to have a band gap and electron emission properties. The surface 201 comprises a series of parallel trenches. Each trench has a cross-section resembling a "u" with squared corners. An incident probability wave 202 of an approaching electron is reflected from surface 201 to give reflected probability wave 203, and from the bottom of the indent to give reflected probability wave 204. Where the depth a of each trench is a solution to $\lambda(1+2n)/4$, where $\lambda$ is the de Broglie wavelength for the approaching electron, n is an integer preferably having a value between 0 and 50 (n=0, 1, 2, . . . 50) and more preferably having a value between 0 and 16 (n=0, 1, 2, . . . 16) and still more preferably having a value between 0 and 4 (n=0, 1, 2, 3, 4), and the width of each trench is of order $2\lambda$, the sum of reflected probability waves will equal zero. As a result, the probability wave 205 will leak through the potential barrier of the surface with increased probability, thus increasing the probability of tunneling in the case shape of potential barrier allows tunneling.

FIG. 3 depicts a method for creating nanostructures of proportions, as above, onto a polymer resist, and then transferred onto a film, preferably metal, deposited on a substrate. This film is used as a mold, with which to stamp other metal films, or alternatively, as a material used for its band gap and electron emission.

In FIG. 3(*a*), particle beam (ion beam or electron beam, for example) 301 is focused to describe a pattern of predetermined shape and depth on the face of a polymer resist, which has been formed onto a film of metal, which is deposited on a substrate. FIG. 3(*b*) shows a 2-dimensional view of the modified molecules, which are developed by a suitable developing agent, to leave the remaining resist, as shown in FIG. 3(*c*). FIG. 3(*d*) shows how the resist and the metal film below it are then etched unidirectionally at a steady pace, to yield the results of the patterned metal film, as shown in FIG. 3(*e*).

This method creates a substance having a band gap and electron emission; however, this method may often be also used to create a mold, which would then be used to form an impression on subsequent surfaces. In an embodiment of the invention, suitable materials (such as a hard metal, with a high melting point, and which does not adhere to other metals) are used to create a mold, using methods described above. The mold is used, as shown in FIG. 5, to stamp other softened metals (attached to the substrates), or to otherwise imprint them with the required pattern. The required surface is equally suitable as its topological opposite, both the mold and the resultant shape have band gap and electron emission properties.

FIG. 4 shows a method by which a charged particle beam patterns a polymer to a more variable depth, in which the metal is patterned to a required depth by its deposition between islands to a required depth, or by subsequent etching until it is a required depth. FIG. 4(*a*) shows a polymer resist 403, mounted directly on a substrate 405, that is patterned by a charged particle beam 401 to a suitable pattern but not necessarily to the finally required depth. FIG. 4(*b*) shows the modified polymer molecules 407, which are developed by a suitable developing agent. FIG. 4(*c*) shows the developed resist, having perhaps a thin layer of resist remaining atop the substrate. Alternatively, the charged particle beam 401 can be aimed at the other areas of resist 403, instead of as shown in FIG. 4(*a*), and then instead of FIG. 4(*b*), a developing agent which develops unmodified molecules could be utilized, to yield the same results as in FIG. 4(*c*), perhaps without the remaining thin layer of resist 403 atop the substrate. In either event, the spacing between the remaining protrusions of resist 403 is of the order of $2\lambda$, as described above.

FIG. 4(*d*) shows a thin layer of remaining resist in the indented areas that may is removed by etching tool 411 that etches the whole polymer resist in a downward direction, until the thin layer disappears, as shown in FIG. 4(*e*). Only islands of resist remain. FIG. 4(*f*) shows metal film 413 that then is unidirectionally deposited upon the substrate and atop the remaining islands of resist 403, to the required depth of the metal film, as described above. Alternatively, the metal film may be deposited too thickly, and then etched away to the required depth. FIG. 4(*g*) shows a remaining polymer resist (and deposited metal which formed above it) that has been removed with a "lift-off" or related technique, to leave just the islands of metal on the surface of the substrate, having the required depth and width. In relation to the substrate itself, these form a surface with an indented cross-section, having a band gap and electron emission.

FIG. 5 shows an embodiment in which a mold 514 having a surface, which is the topological opposite of the nanostructure to be created, is pressed into a softened metal 515 coated on a substrate. The metal is hardened and the mold is removed.

Figure 6:
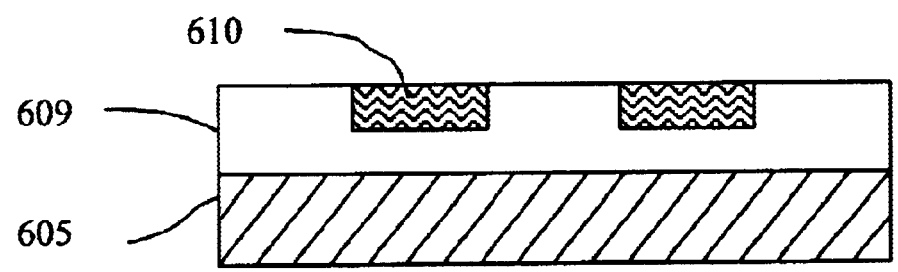
FIG. 6 illustrates an embodiment of the present invention having the required shape for de Broglie interference, but having oxidized regions to cause this interference, instead of a ridged surface.
Figure 7A:
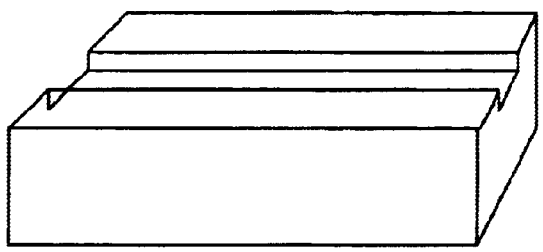
FIG. 7 illustrates several different surface configurations, mostly 3-dimensional, whilst the pattern of hexagons in FIG. 7(c) is a 2-dimensional view depicting two heights of surface, in the shape of hexagons.
Figure 7B:
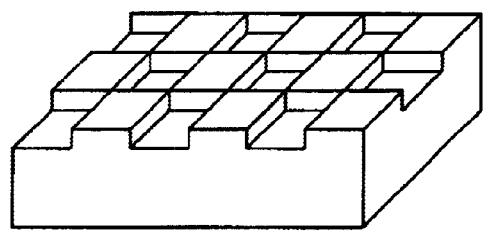
Figure 7C:
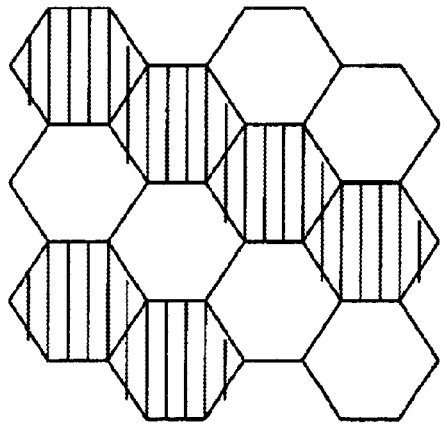
Figure 7D:
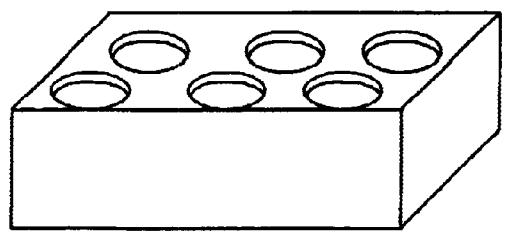

FIG. 6 illustrates an embodiment of the invention. A metal film 609 is mounted on the substrate 605, and that is in the aim of an oxygen beam. The metal forms a stable oxide in the regions which are beamed 610, and the resultant configuration between oxidized and non-oxidized regions creates a surface structure capable of the required de Broglie interference.

In another embodiment of the invention, the surface comprises a series of parallel ridges. Each ridge has a cross-section resembling a "mesa" or "plateau" with squared corners. The height a of each ridge and the width of each ridge correspond to the equations as above.

FIGS. 7(*a*)–(*d*) demonstrate another embodiment of the invention. In FIG. 7(*a*), the surface comprises a checkerboard-type arrangement of rows of individual rectangular-shaped "mesas" or "plateaus" and/or rows of individual rectangular-shaped "holes." The height a of each "mesa" (and/or the depth of each "hole") correspond to the equations as above. Alternatively, as in FIGS. 7(*b*)–(*d*), 3-dimensional or 2-dimensional views of the upper surface, having appropriately scaled measurements, show a set of triangles, pentagons, hexagons, heptagons, octagons, circles, polygons, or combinations thereof. It is important that the surface area of the top of the lower area and that of the top of the higher area be identical, and it is preferable that they also form the same shape as each other, as may be obtained for most but not all of the embodiments mentioned above.

The wave interference as described is to provide a metal or other material with a band gap, and also, it encourages particle emission. Some materials, such as semiconductors, already contain one large or several smaller band gaps, and in one embodiment of the present invention, the modified surface does not create a band gap but increases an already present band gap. Methods to form a desired band gap, or a desired level of particle emission, may include altering the precision with which the wave interference structure is created. Using the relationship to the de Broglie wavelength discussed above, a configuration of a desired material is determined that will produce the desired band gap in the desired material. Finally, a surface of the material is formed to the determined configuration.

Thus, it is apparent that there has been provided, in accordance with the invention, a method and apparatus for a band gap material that satisfies the advantages set forth above. Thus, the band gap material of the invention may be used in virtually all semiconductor material applications. Furthermore, the same method of providing a band gap in a material can be used to provide electron emission properties in that same material, since the two are related features, as has been described.

The mold can be fabricated using techniques which allow anisotropic etching to achieve 90° angles. For example, it can be made from an anisotropic material, such as single crystal silicon, so that etching, for example anisotropic reactive ion etching, can take place only in the direction normal to the surface. The mold is made from a material which does not significantly adhere to the metal used in order to avoid damage to the metal film structure in the process of removing the mold.

Figure 5A:
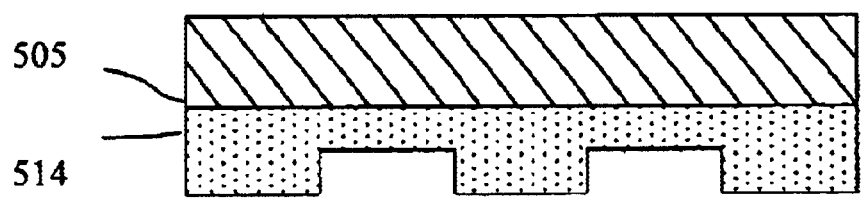
FIG. 5 shows how a mold, created by the method described with reference to FIG. 1 (or with another, also viable structure or method as described elsewhere in this patent), is used to imprint other, softened metals, to create in them the required surface structure for band gap and electron emission properties.
Figure 5B:
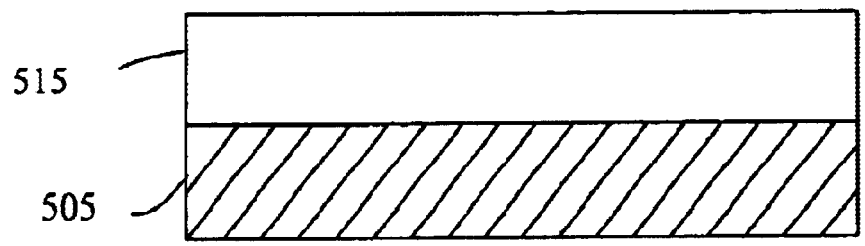

Referring to FIG. 5(a), a mold 514 whose surface carries a nanostructure which is the topological opposite of the nanostructure pattern to be fabricated, in that the mold 514 has protruding areas where indentations are desired in the final product, and carries indentations where protrusions are required in the final product, is pressed into a softened metal film 515 coated on a substrate 505.

In another embodiment, the metal film is softened by heating. The pressure used for imprinting and film temperature is adjusted for particular metal used. In some embodiments, the metal of the final surface may be in liquid or even gas form, and solidify around the mold.

The substrate is preferably silicon, but may be any material which has a melting or softening temperature greater than that of the metal-coating. In an embodiment of the invention, gold is used, but any metal which has a melting or softening temperature below that of the substrate material may be used. Some non-metals may also be used.

Metal film 515 is cooled and mold is removed to give the nano-structured surface.

Thus, the method for fabricating metal nano-structures on substrate surfaces described above, using a mold, is a low-cost, high-throughput technique especially as compared to using lithographic methods directly onto the eventual surface, and yet it can achieve resolutions of less than 50 nm. The method is of great utility in the introduction or improvement of a band gap to a material and in the construction of surfaces having enhanced electron emission.

The invention should not be construed as limited to the specific embodiments and methods described above but should be seen to include equivalent embodiments and methods. For example, the substrate may be any material which has a melting or softening temperature greater than that of the metal-coating, and materials include silica, quartz, glass, diamond, and metal. Furthermore, the material used to coat the substrate is specified as being a metal, but it may be any substance which has a melting or softening temperature below that of the substrate material, including metals such as silver, nickel, and titanium, alloys, semiconductor materials, superconductor materials or polymers.

Structures have been described in detail but should not be construed as the only possible configurations falling under the scope of the present invention. For example, in an embodiment, the shape of the surface is described as having trenches running across its length. In a similar fashion, the trenches could run across the width of the surface. The word 'length' has been used to denote a continuous trench. In a similar fashion, the trenches could run almost but not quite until the edges the surface, or could indeed run the entire length of the surface. As stated, the word 'length' has been used to denote a continuous trench, and not to limit the length to having to span the entire surface length.

A main focus of the invention is in having indents (or protrusions) of a required depth, or pitch. The shape of the indents however is not specified explicitly, because it could take on many forms and sizes all falling within the scope of the invention. For example, instead of long trenches, these could be checkerboard shape, with the black squares for example, representing surface indentations, and white squares, protrusions. There could be hexagons, octagons or heptagons, or even circles, imprinted into or protruding out of the surface.

It is preferable that the top surface area of the protruding regions of the surface be identical to the top surface area of the indented regions. It is also preferable, but not crucial, that the shape of the protruding regions be identical to the shape of the indented regions. Furthermore, it is preferable but by no means crucial that there should be as few sharp corners in the side walls of the protrusions or indentations as possible. This minimizes the de Broglie diffraction. For this reason, a preferred geometry is long trenches, as opposed to the checkerboard shape, however, the checkerboard shape also falls within the scope of the present invention. However, the structures described are just a few embodiments of the present invention, which could have regular indents, irregular, combinations of various shapes, etc. There could be a stepped surface, having more than one depth of indent, and there could be more than one surface indented. The focus of this specification is on creating surface conditions for wave interference on the tiny scale necessary for electrons and other elementary particles, and the invention should be construed in the light of the appended claims and their legal equivalents.

Indentations and protrusions to a basic surface are both described in the specification, and there is really little technical difference between the two, except in their production method. Where an indented surface is referred to, it should be read as also referring to a surface having protrusions, which, by definition, causes the surface to have an indented cross-section, having indents in the 'spaces' between the protrusions.

While the specification refers to indentations, it is not intended to limit the present invention to a plurality of indentations, indeed, a single indented region will often be the configuration of choice.

The specification refers to modifying a single surface of a substrate, however, in some embodiments, more than one surface may have a patterned structure, to cause interference.

In some cases the present invention may have to be used only in a vacuum, to prevent surface decomposition, however in other cases, this may not prove necessary, e.g. when the metal involved is known to produce a stable and very thin oxide layer, then it may be usable even without a vacuum, with the oxide layer not being substantially detrimental to wave interference.

Current lithographic techniques have been described in creation of the mold, but other direct techniques are possible such as focused ion beam processing.

What is claimed is:

1. A process for making an elementary particle emitting surface, comprising the steps of:

a. positioning into the path of a particle beam a layer of material whose molecules are modified when exposed to said particle beam, b. directionally focusing said particle beam on said material and exposing a pattern of molecules to the beam such that the modified molecules and the unmodified molecules of said material form a pattern wherein the depth of the modified molecules relative to the unmodified molecules is given by the relationship $\lambda(1+2n)/4$, wherein $\lambda$ is the de Broglie wavelength of an incident electron, and n is 0 or a positive integer suitable for causing de Broglie interference between elementary particles upon the development of the modified or the unmodified molecules, c. developing said material to remove either said modified molecules or said unmodified molecules, whereby molecules not removed by said developing form protruding portions of an indented cross-section, d. transferring the pattern of said indented cross-section or a relief thereof to a surface of a substrate whereby the surface of said substrate or said substrate in combination with the surface of said substrate, if the surface is not of identical composition to the substrate itself, has an indented cross-section.

2. The process of claim 1 wherein said directionally focusing is limited to focusing at a 90 degree angle to the surface, to modify molecules directly below one another.

3. The process of claim 1 wherein said particle beam is an electron beam.

4. The process of claim 3 further comprising a step of mounting said material on said substrate prior to exposure of said material to said electron beam.

5. The process of claim 4 wherein said material comprises a polymer, and further wherein the step of mounting said polymer on said substrate comprises spin coating said polymer onto said substance.

6. The process of claim 4 wherein the step of transferring said pattern comprises transferring said pattern to a surface of said substrate beneath said polymer.

7. The process of claim 6 wherein the step of transferring said pattern to said substrate beneath said polymer comprises etching.

8. The process of claim 7 wherein said etching comprises an etching process selected from the group consisting of: chemical etching, isotropic etching, and anisotropic etching.

9. The process of claim 4 further comprising the step of mounting said material on said substrate prior to exposure of said material to said electron beam, wherein, said exposing and said developing act to remove all of the material from upon said substrate except for the protruding portions of said indented cross-section.

10. The process of claim 4 further comprising the step of depositing a second material on said material after developing said material, but prior to transferring said pattern, such that said second material covers at least the areas of said substrate which are not covered by said protruding portions of said indented cross-section.

11. The process of claim 10 wherein the step of transferring said pattern or a relief thereof to said substrate comprises removing said protruding portions of said indented cross-section and any parts of said second material which may be lying above said protruding portions of said indented cross-section, whereby only the second material which covered the exposed substrate remains upon the substrate in the shape of the spaces between said protruding portions of said indented cross-section, being a relief of said pattern.

12. The process of claim 11 wherein said removing comprises a process selected from the group consisting of: chemical etching, isotropic etching, anisotropic etching, evaporating and dissolving, and lift-off.

13. The process of claim 12 further comprising the step of connecting the substrate to a source of electrons, whereby electrons are emitted by consequence from the formed structure.

14. The process of claim 1 wherein said particle beam is an oxygen atom beam.

15. The process of claim 14 wherein the step of transferring said pattern to said substrate is done by isotropically oxidizing said surface of said substrate.

16. The process of claim 1 additionally comprising the steps of:
   a. providing a second substrate coated with a polymer coat,
   b. pressing said substrate having said indented cross-section against said polymer coat on said second substrate,
   c. etching said second substrate using a constant rate etchant to yield a predetermined pattern on the surface of said second substrate.

17. The process of claim 1 additionally comprising the steps of:
   a. bringing said substrate having said indented cross-section into contact with a second substrate,
   b. applying pressure to said substrate having said indented cross-section, to create in said second substrate a relief of said indented cross-section.

18. The process of claim 17, wherein said second substrate has a melting temperature lower than said substrate having said indented cross-section, and additionally comprising the step of heating said second substrate, whereby said second substrate is softened.

19. The process of claim 18 additionally comprising the step of treating said second substrate with a hardening agent after said impressions have been formed, whereby said second substrate is hardened.

20. The process of claim 7 further comprising the step of connecting said substrate to a source of electrons, whereby the formed structure has a band gap.

* * * * *